US009825004B2

(12) United States Patent
Jung

(10) Patent No.: US 9,825,004 B2
(45) Date of Patent: Nov. 21, 2017

(54) SEMICONDUCTOR DEVICE

(71) Applicant: SK hynix Inc., Gyeonggi-do (KR)

(72) Inventor: Ho-Don Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 579 days.

(21) Appl. No.: 14/543,512

(22) Filed: Nov. 17, 2014

(65) Prior Publication Data

US 2015/0364447 A1 Dec. 17, 2015

(30) Foreign Application Priority Data

Jun. 16, 2014 (KR) .................. 10-2014-0072890

(51) Int. Cl.
*H01L 23/02* (2006.01)
*H01L 25/065* (2006.01)
*H01L 23/498* (2006.01)
*H01L 23/50* (2006.01)

(52) U.S. Cl.
CPC .... *H01L 25/0657* (2013.01); *H01L 23/49816* (2013.01); *H01L 23/49838* (2013.01); *H01L 23/50* (2013.01); *H01L 2225/06506* (2013.01); *H01L 2225/06513* (2013.01); *H01L 2924/0002* (2013.01)

(58) Field of Classification Search
CPC ...................... H01L 33/62; H05K 2201/10234
See application file for complete search history.

(56) References Cited

U.S. PATENT DOCUMENTS 7,122,905 B2* 10/2006 Grigg .................. H05K 3/3436
257/778
8,952,517 B2* 2/2015 Kwon ................. H01L 25/0657
257/686

FOREIGN PATENT DOCUMENTS

KR 1020050063052 6/2005

* cited by examiner

*Primary Examiner* — Zandra Smith
*Assistant Examiner* — Andre' C Stevenson
(74) *Attorney, Agent, or Firm* — IP & T Group LLP

(57) ABSTRACT

A semiconductor device includes a package interface including N numbers of first group of data balls which are disposed on a first side thereof, N numbers of second group of data balls which are disposed on a second side thereof, and M numbers of command/address balls which are disposed between the first side and the second side; a first semiconductor chip which is stacked on the first side over the package interface, and includes 2N numbers of first group of data pads and M numbers of first command/address pads; and a second semiconductor chip which is stacked on the second side over the package interface, and includes 2N numbers of second group of data pads and M numbers of second command/address pads.

20 Claims, 4 Drawing Sheets

SEMICONDUCTOR DEVICE

CROSS-REFERENCE TO RELATED APPLICATIONS

The present application claims priority of Korean Patent Application No. 10-2014-0072890, filed on Jun. 16, 2014, which is incorporated herein by reference in its entirety.

BACKGROUND

1. Field

Exemplary embodiments of the present invention relate to a semiconductor design technology, and more particularly, to a package interface of a semiconductor device including a plurality of semiconductor chips.

2. Description of the Related Art

A multi chip package where a plurality of semiconductor chips are perpendicularly disposed is being developed to satisfy the demand for multi-functionality, high-speed operation and large-capacity storage in electronic/information appliances, and to miniaturize the electronic/information devices by improving packaging density of memory modules.

SUMMARY

Exemplary embodiments of the present invention are directed to a semiconductor device where two semiconductor chips are disposed on one package interface.

In accordance with an embodiment of the present invention, a semiconductor device includes: a package interface including N numbers of first group of data balls which are disposed on a first side thereof, N numbers of a second group of data balls which are disposed on a second side thereof, and M numbers of command/address balls which are disposed between the first side and the second side; a first semiconductor chip which is stacked on the first side over the package interface, and includes 2N numbers of a first group of data pads and M numbers of first command/address pads; and a second semiconductor chip which is stacked on the second side over the package interface, and includes 2N numbers of a second group of data pads and M numbers of second command/address pads, wherein M numbers of the first command/address pads and M numbers of the second command/address pads are commonly coupled with M numbers of the command/address balls, wherein a half of the 2N numbers of the first group of data pads are coupled with the N numbers of the first group of data balls, and wherein a half of the 2N numbers of the second group of data pads are coupled with the N numbers of the second group of data balls.

In accordance with another embodiment of the present invention, a semiconductor device includes: a package interface including a half of N numbers of a first group of data balls which are disposed in a first region of a first side, the other half of N numbers of the first group of data balls which are disposed in a second region of the first side, a half of N numbers of the second group of data balls which are disposed in a first region of a second side, the other half of N numbers of the second group of data balls which are disposed in a second region of the second side, and M numbers of command/address balls which are disposed in a middle region between the first side and the second side; a first semiconductor chip which is stacked over the package interface and overlaps with the first region of the first side, the second region of the first side and a part of the middle region, and includes 2N numbers of first group of data pads and M numbers of first command/address pads; and a second semiconductor chip which is stacked over the package interface and overlaps with the first region of the second side, the second region of the second side and another part of the middle region, and includes 2N numbers of second group of data pads and M numbers of second command/address pads, wherein M numbers of the first command/address pads and M numbers of the second command/address pads are commonly coupled with M numbers of the address/command balls, wherein a quarter of 2N numbers of the first group of data pads overlapping with the first region of the first side are coupled with the half of N numbers of the first group of data balls, wherein another quarter of 2N numbers of the first group of data pads overlapping with the second region of the first side are coupled with the other half of N numbers of the first group of data balls, wherein a quarter of 2N numbers of the second group of data pads overlapping with the first region of the second side are coupled with a half of N numbers of the second group of data balls, and wherein another quarter of 2N numbers of the second group of data pads overlapping with the second region of the second side are coupled with the other half of N numbers of the second group of data balls.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art.

Figure 1:
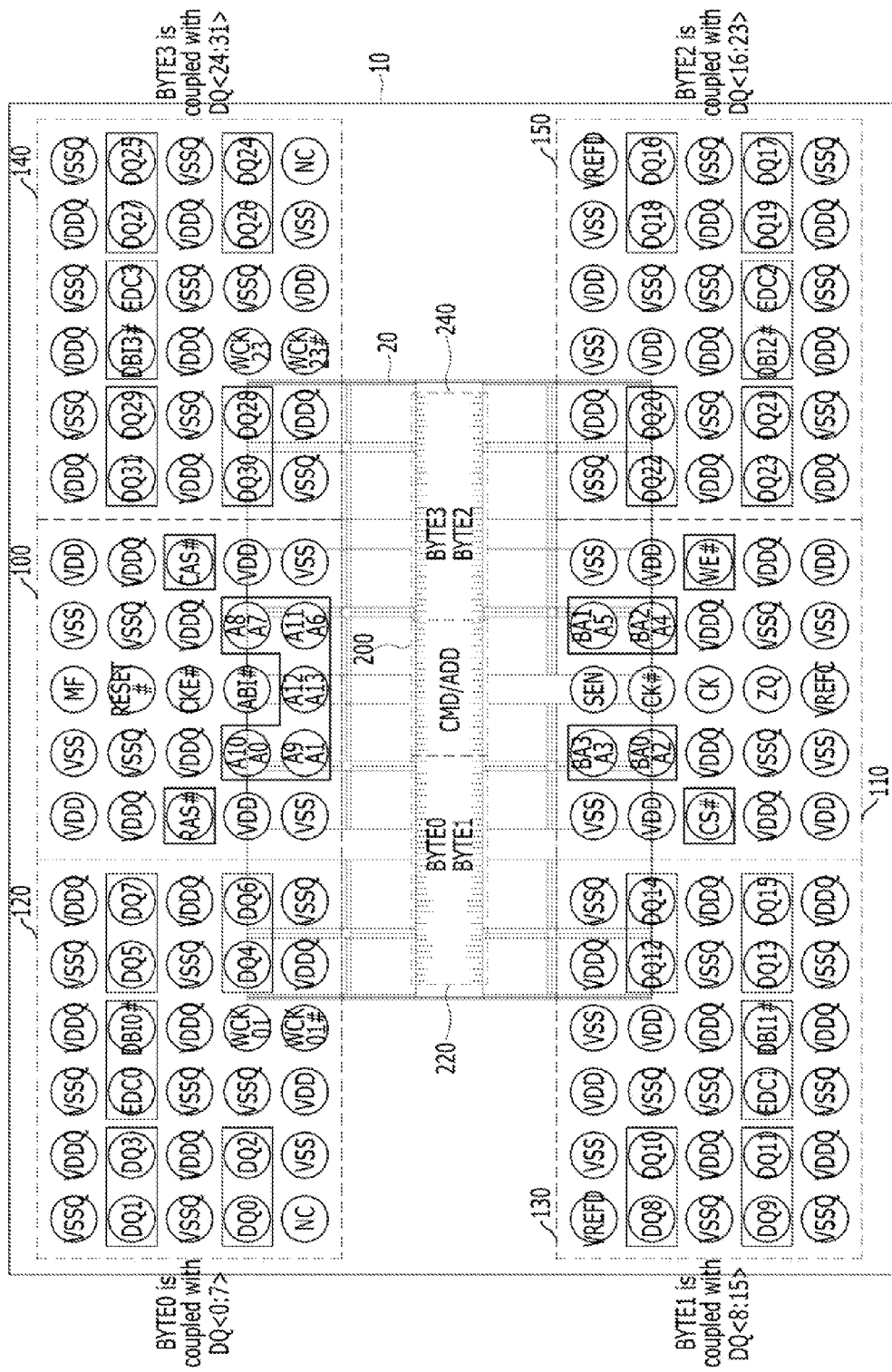
FIG. 1 illustrates a single semiconductor chip stacked on a package interface of a semiconductor device.

FIG. 1 illustrates one semiconductor chip stacked on a package interface of a semiconductor device.

Referring to FIG. 1, a single semiconductor chip 20 is stacked on a package interface 10.

The package interface 10 includes N numbers of first group of data balls DQ<0:7> and DQ<8:15> which are disposed in two regions 120 and 130 on one side (referred to as "one-side regions 120 and 130") of the package interface 10, N numbers of second group of data balls DQ<16:23> and DQ<24:31> which are disposed in two regions 140 and 150 on the other side (referred to as "the other-side regions 140 and 150") of the package interface 10, and M numbers of command/address balls RAS#, CAS#, CS# and WE#/A<0:13> and BA<0:3> which are disposed in middle regions 100 and 110 between the regions 120 and 130 on one side and the regions 140 and 150 on the other side of the package interface 10.

The semiconductor chip 20 is stacked overlapping with the one-side regions 120 and 130, the other-side regions 140 and 150 and the middle regions 100 and 110 over the package interface 10. The semiconductor chip 20 includes 2N numbers of data pads BYTE0, BYTE1, BYTE2 and BYTE3 and M numbers of command/address pads CMD/

ADD. The 2N numbers of data pads BYTE0, BYTE1, BYTE2 and BYTE3 are divided into N numbers of first group of data pads BYTE0 and BYTE1 which are disposed in a first region 220 of the semiconductor chip 20 and N numbers of second group of data pads BYTE2 and BYTE3 which are disposed in a second region 240 of the semiconductor chip 20. The M numbers of command/address pads CMD/ADD are disposed in a middle region 200 between the first region 220 and the second region 240 of the semiconductor chip 20.

Since the semiconductor chip 20 is stacked in the middle regions 100 and 110 over the package interface 10, the first region 220 of the semiconductor chip 20 is disposed adjacent to the one-side regions 120 and 130 of the package interface 10, and the second region 240 of the semiconductor chip 20 is disposed adjacent to the other-side regions 140 and 150 of the package interface 10.

N numbers of the first group of data balls DQ<0:7> and DQ<8:15> and N numbers of the first group of data pads BYTE0 and BYTE1 which are disposed adjacent to each other are coupled with each other.

N numbers of the second group of data balls DQ<16:23> and DQ<24:31> and N of the second group of data pads BYTE2 and BYTE3 which are disposed adjacent to each other are coupled with each other.

M numbers of the command/address balls RAS#, CAS#, CS# and WE#/A<0:13> and BA<0:3> and M numbers of the command/address pads CMD/ADD are coupled with each other.

When the semiconductor chip 20 is stacked on the package interface 10 as described above, the semiconductor chip 20 which is stacked in the middle regions 100 and 110 of the package interface uses all of 2N numbers of the first and second groups of data balls DQ<0:7>, DQ<8:15>, DQ<16:23> and DQ<24:31> and M numbers of the command/address balls RAS#, CAS#, CS# and WE#/A<0:13> and BA<0:3>. In other words, the semiconductor chip 20 uses 2N numbers of the first and second groups of data balls DQ<0:7>, DQ<8:15>, DQ<16:23> and DQ<24:31> of the package interface 10 which are coupled to 2N numbers of first and second group of data pads BYTE0, BYTE1, BYTE2 and BYTE3, respectively. Similarly, the semiconductor chip 20 uses M numbers of command/address balls RAS#, CAS#, CS# and WE#/A<0:13> and BA<0:3> of the package interface 10 which are coupled to M numbers of command/address pads CMD/ADD, respectively.

Figure 2:
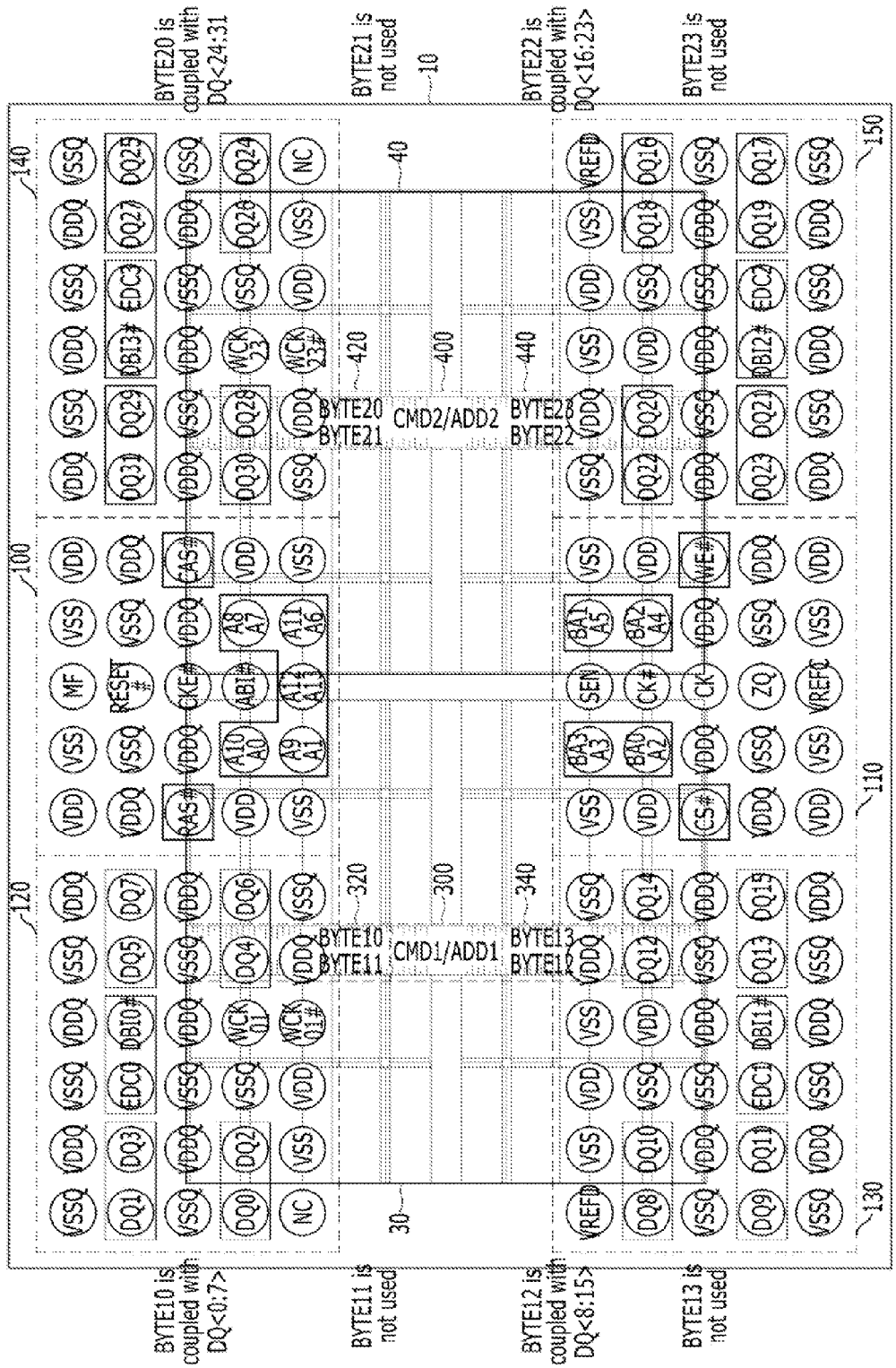
FIG. 2 illustrates two semiconductor chips stacked in parallel on a package interface of a semiconductor device in accordance with an embodiment of the present invention.

FIG. 2 illustrates two semiconductor chips stacked in parallel on a package interface of a semiconductor device in accordance with an embodiment of the present invention.

Referring to FIG. 2, a first semiconductor chip 30 and a second semiconductor chip 40 may be stacked in parallel over a package interface 10 of the semiconductor device.

The package interface 10 may include N numbers of first group of data balls DQ<0:7> and DQ<8:15> which are disposed in two regions 120 and 130 on one side (referred to as "one-side regions 120 and 130") of the package interface 10, N numbers of second group of data balls DQ<16:23> and DQ<24:31> which are disposed in two regions 140 and 150 on the other side (referred to as "the other-side regions 140 and 150") of the package interface 10, and M numbers of command/address balls RAS#, CAS#, CS# and WE#/A<0:13> and BA<0:3> which are disposed in middle regions 100 and 110 between the regions 120 and 130 on one side and the regions 140 and 150 on the other side of the package interface 10. N numbers of the first group of data balls DQ<0:7> and DQ<8:15> may be divided into a half of N numbers of the first group of data balls DQ<0:7> which are disposed in a first region 120 of the one-side regions 120 and 130 of the package interface 10 and the other half of N numbers of the first group of data balls DQ<8:15> which are disposed in a second region 130 of the one-side regions 120 and 130 of the package interface 10. N numbers of the second group of data balls DQ<16:23> and DQ<24:31> may be divided into a half of N numbers of the second group of data balls DQ<16:23> which are disposed in a first region 140 of the other-side regions 140 and 150 of the package interface 10 and the other half of N numbers of the second group of data balls DQ<24:31> which are disposed in a second region 150 of the other-side regions 140 and 150 of the package interface 10. M numbers of the command/address balls RAS#, CAS#, CS# and WE#/A<0:13> and BA<0:3> may be disposed in the middle region 100 between the first region 120 of the one-side regions 120 and 130 and the first region 140 of the other-side regions 140 and 150 of the package interface 10, and in the middle region 110 between the second region 130 of the one-side regions 120 and 130 and the second region 150 of the other-side regions 140 and 150 of the package interface 10.

The structure of the package interface 10 shown in FIG. 2 may be completely the same as the structure of the package interface 10 shown in FIG. 1.

The first semiconductor chip 30 may be stacked on the one-side regions 120 and 130 over the package interface 10. In other words, the first semiconductor chip 30 may be stacked over the package interface 10, and may overlap with the first region 120 and the second region 130 of the one-side regions 120 and 130 and a part of the middle regions 100 and 110 of the package interface 10. The first semiconductor chip 30 includes 2N numbers of the first group of data pads BYTE10, BYTE11, BYTE12 and BYTE13 and M numbers of first command/address pads CMD1/ADD1. 2N numbers of the first group of data pads BYTE10, BYTE11, BYTE12 and BYTE13 may be divided into a half of 2N numbers of the first group of data pads BYTE10 and BYTE11 which are disposed in a first region 320 of the first semiconductor chip 30 and the other half of 2N numbers of the first group of data pads BYTE12 and BYTE13 which are disposed in a second region 340 of the first semiconductor chip 30. M numbers of the first command/address pads CMD1/ADD1 are disposed in a middle region 300 between the first region 320 and the second region 340 of the first semiconductor chip 30.

The structure of the first semiconductor chip 30 shown in FIG. 2 is similar to the structure of the semiconductor chip 20 shown in FIG. 1. Since the first semiconductor chip 30 is stacked on the one-side regions 120 and 130 over the package interface 10, the first region 320 of the first semiconductor chip 30 is disposed adjacent to the first region 120 of the one-side regions 120 and 130, and the second region 340 of the first semiconductor chip 30 is disposed adjacent to the second region 130 of the one-side regions 120 and 130.

The second semiconductor chip 40 may be stacked on the other-side regions 140 and 150 over the package interface 10. In other words, the second semiconductor chip 40 may be stacked over the package interface 10, and may overlap with the first region 140 and the second region 150 of the other-side regions 140 and 150 and a part of the middle regions 100 and 110 of the package interface 10. The second semiconductor chip 40 includes 2N numbers of the second group of data pads BYTE20, BYTE21, BYTE22 and BYTE23 and M numbers of second command/address pads CMD2/ADD2. 2N numbers of the second group of data pads BYTE20, BYTE21, BYTE22 and BYTE23 may be divided into a half of 2N numbers of the second group of data pads BYTE20 and BYTE21 which are disposed in a first region 420 of the second semiconductor chip 40 and the other half of 2N numbers of the second group of data pads BYTE22 and BYTE23 which are disposed in a second region 440 of the second semiconductor chip 40. M numbers of the second command/address pads CMD2/ADD2 are disposed in a middle region 400 between the first region 420 and the second region 440 of the second semiconductor chip 40.

The structure of the second semiconductor chip 40 shown in FIG. 2 is similar to the structure of the semiconductor chip 20 shown in FIG. 1. Since the first semiconductor chip 40 is stacked on the other-side regions 140 and 150 over the package interface 10, the first region 420 of the second semiconductor chip 40 is disposed adjacent to the first region 140 of the other-side regions 140 and 150, and the second region 440 of the second semiconductor chip 40 is disposed adjacent to the second region 150 of the other-side regions 140 and 150.

M numbers of the first command/address pads CMD1/ADD1 included in the first semiconductor chip 30 and M numbers of the second command/address pads CMD2/ADD2 included in the second semiconductor chip 40 may be coupled in common with M numbers of the command/address balls RAS#, CAS#, CS# and WE#/A<0:13> and BA<0:3> included in the package interface 10.

N numbers of the first group of data pads BYTE10 and BYTE12 among 2N numbers of the first group of data pads BYTE10, BYTE11, BYTE12 and BYTE13 included in the first semiconductor chip 30 which are disposed adjacent to each other may be coupled with N numbers of the first group of data balls DQ<0:7> and DQ<8:15> included in the package interface 10. Although they are disposed adjacent to each other, the other half of 2N numbers of the first group of data pads BYTE11 and BYTE 13 among 2N numbers of the first group of data pads BYTE10, BYTE11, BYTE12 and BYTE13 included in the first semiconductor chip 30 may not be used. This is because the half of N numbers of the first group of data pad BYTE10 overlapping with the first region 120 of the one-side regions 120 and 130 of the package interface 10 among 2N numbers of the first group of data pads BYTE10, BYTE11, BYTE12 and BYTE13 may be set to be coupled with the a half of N numbers of the first group of data balls DQ<0:7>, and the other half of N numbers of the first group of data pad BYTE12 overlapping with the second region 130 of the one-side regions 120 and 130 of the package interface 10 among 2N numbers of the first group of data pads BYTE10, BYTE11, BYTE12 and BYTE13 may be set to be coupled with the other half of N numbers of the first group of data balls DQ<8:15>. To be specific, a quarter of 2N numbers of the first group of data pads BYTE10 among the half of 2N numbers of the first group of data pads BYTE10 and BYTE11 and the half of N numbers of the first group of data balls DQ<0:7> are coupled with each other, and the other quarter of 2N numbers of the first group of data pad BYTE11 may not be coupled with the package interface 10. Also, a quarter of 2N numbers of the first group of data pads BYTE12 among the other half of 2N numbers of the first group of data pads BYTE12 and BYTE13 and the second group of data balls DQ<8:15> are coupled with each other, and the other quarter of 2N numbers of the first group of data pads BYTE13 may not be coupled with the package interface 10.

To sum up, when the first semiconductor chip 30 including the 2N numbers of the first group of data pads BYTE10, BYTE11, BYTE12 and BYTE13 is applied to a structure where the semiconductor chip 20 shown in FIG. 1 is stacked on the package interface 10, the semiconductor chips 20 may operate with 2N-bit bandwidth where a 2N-bit data is simultaneously inputted/outputted.

However, since N numbers of the first group of data pads BYTE10 and BYTE12 among 2N numbers of the first group of data pads BYTE10, BYTE11, BYTE12 and BYTE13 included in the first semiconductor chip 30 may be coupled with N numbers of the first group of data balls DQ<0:7> and DQ<8:15> included in the package interface 10, and the other N numbers of the first group of data pads BYTE11 and BYTE13 may not be coupled with the package interface 10 in the embodiment of the present invention shown in FIG. 2, the first semiconductor chip 30 may operate with N-bit bandwidth where N-bit data is simultaneously inputted/outputted.

N numbers of the second group of data pads BYTE20 and BYTE22 among 2N numbers of the second group of data pads BYTE20, BYTE21, BYTE22 and BYTE23 included in the second semiconductor chip 40 which are disposed adjacent to each other may be coupled with N numbers of the second group of data balls DQ<16:23> and DQ<24:31> included in the package interface 10. Although they are disposed adjacent to each other, the other half of 2N numbers of the second group of data pads BYTE21 and BYTE23 among 2N numbers of the second group of data pads BYTE20, BYTE21, BYTE22 and BYTE23 included in the second semiconductor chip 40 may not be used. This is because the half of N numbers of the second group of data pad BYTE20 overlapping with the first region 140 of the other-side regions 140 and 150 of the package interface 10 among 2N numbers of the second group of data pads BYTE20, BYTE21, BYTE22 and BYTE23 may be set to be coupled with the a half of N numbers of the second group of data balls DQ<16:23>, and the other half of N numbers of the second group of data pad BYTE22 overlapping with the second region 150 of the other-side regions 140 and 150 of the package interface 10 among 2N numbers of the second group of data pads BYTE20, BYTE21, BYTE22 and BYTE23 may be set to be coupled with the other half of N numbers of the second group of data balls DQ<24:31>. To be specific, a quarter of 2N numbers of the second group of data pads BYTE20 among the half of 2N numbers of the second group of data pads BYTE20 and BYTE21 and the half of N numbers of the second group of data balls DQ<16:23> are coupled with each other, and the other quarter of 2N numbers of the second group of data pads BYTE21 may not be coupled with the package interface 10. Also, a quarter of 2N numbers of the second group of data pads BYTE22 among the other half of 2N numbers of the second group of data pads BYTE22 and BYTE23 and the other half of N numbers of the second group of data balls DQ<24:31> are coupled with each other, and the other quarter of 2N numbers of the second group of data pads BYTE23 may not be coupled with the package interface 10.

To sum up, when the second semiconductor chip 40 including 2N numbers of the second group of data pads BYTE20, BYTE21, BYTE22 and BYTE23 is applied to a structure where the semiconductor chip 20 shown in FIG. 1 is stacked on the package interface 10, the semiconductor chips 20 may operate with 2N-bit bandwidth where a 2N-bit data is simultaneously inputted/outputted.

However, since N numbers of second group of data pads BYTE20 and BYTE22 among 2N numbers of the second group of data pads BYTE20, BYTE21, BYTE22 and BYTE23 included in the second semiconductor chip 40 may be coupled with N numbers of the second group of data balls DQ<16:23> and DQ<24:31> included in the package interface 10, and the other N numbers of the second group of data pads BYTE21 and BYTE23 may not be coupled with the package interface 10 in the embodiment of the present invention shown in FIG. 2, the second semiconductor chip 40 may operate with N-bit bandwidth where N-bit data is simultaneously inputted/outputted.

As described above, in accordance with the embodiment of the present invention, the first semiconductor chip 30 and the second semiconductor chip 40 individually operate with the N-bit bandwidth. However, the first and second semiconductor chips 30 and 40 may be simultaneously enabled. In this case, the package interface 10 may operate with the 2N-bit bandwidth where a 2N-bit data is simultaneously inputted/outputted by using N numbers of the first group of data balls DQ<0:7> and DQ<8:15> and the N numbers of the second group of data balls DQ<16:23> and DQ<24:31>.

In other words, the package interface 10 with the single semiconductor chip 20 stacked thereon as shown in FIG. 1 operates with the 2N-bit bandwidth where the 2N-bit data is simultaneously inputted/outputted, and similarly, in accordance with the embodiment of the present invention, the package interface 10 with the first and second semiconductor chips 30 and 40 stacked in parallel thereon as shown in FIG. 2 may operate with the 2N-bit bandwidth where the 2N-bit data is simultaneously inputted/outputted.

Since the semiconductor chips 30 and 40 of the package interface 10 shown in FIG. 2 in accordance with the embodiment of the present invention commonly use the command/address balls RAS#, CAS#, CS# and WE#/A<0:13> and BA<0:3>, and simultaneously receive them, the two semiconductor chips 30 and 40 may operate as a single semiconductor chip.

Therefore, the semiconductor device shown in FIG. 2 in accordance with the embodiment of the present invention and the semiconductor device shown in FIG. 1 may seem as if they operate in the completely same way. However, since the two semiconductor chips 30 and 40 are stacked in parallel over the package interface 10 of the semiconductor device shown in FIG. 2, and the single semiconductor chip 20 is stacked over the package interface 10 of the semiconductor device shown in FIG. 1, the storage capacity of the package interface 10 of the semiconductor device shown in FIG. 2 may be two times larger than the storage capacity of the package interface 10 of the semiconductor device shown in FIG. 1.

In the aforementioned structure, it is described that the first semiconductor chip 30 may be stacked on the one-side regions 120 and 130 over the package interface 10, and the second semiconductor chip 40 may be staked on the other-side regions 140 and 150 over the package interface 10. As illustrated in FIG. 2, the one-side regions 120 and 130 may be disposed on the left side of the package interface 10, and the other-side regions 140 and 150 may be disposed on the right side of the package interface 10.

However, the structure shown in FIG. 2 is just one embodiment. Depending the device design, the one-side regions 120 and 130 may be disposed on the right side of the package interface 10, and the other-side regions 140 and 150 may be disposed on the left side of the package interface 10, differently from what is shown in the drawing.

Figure 3:
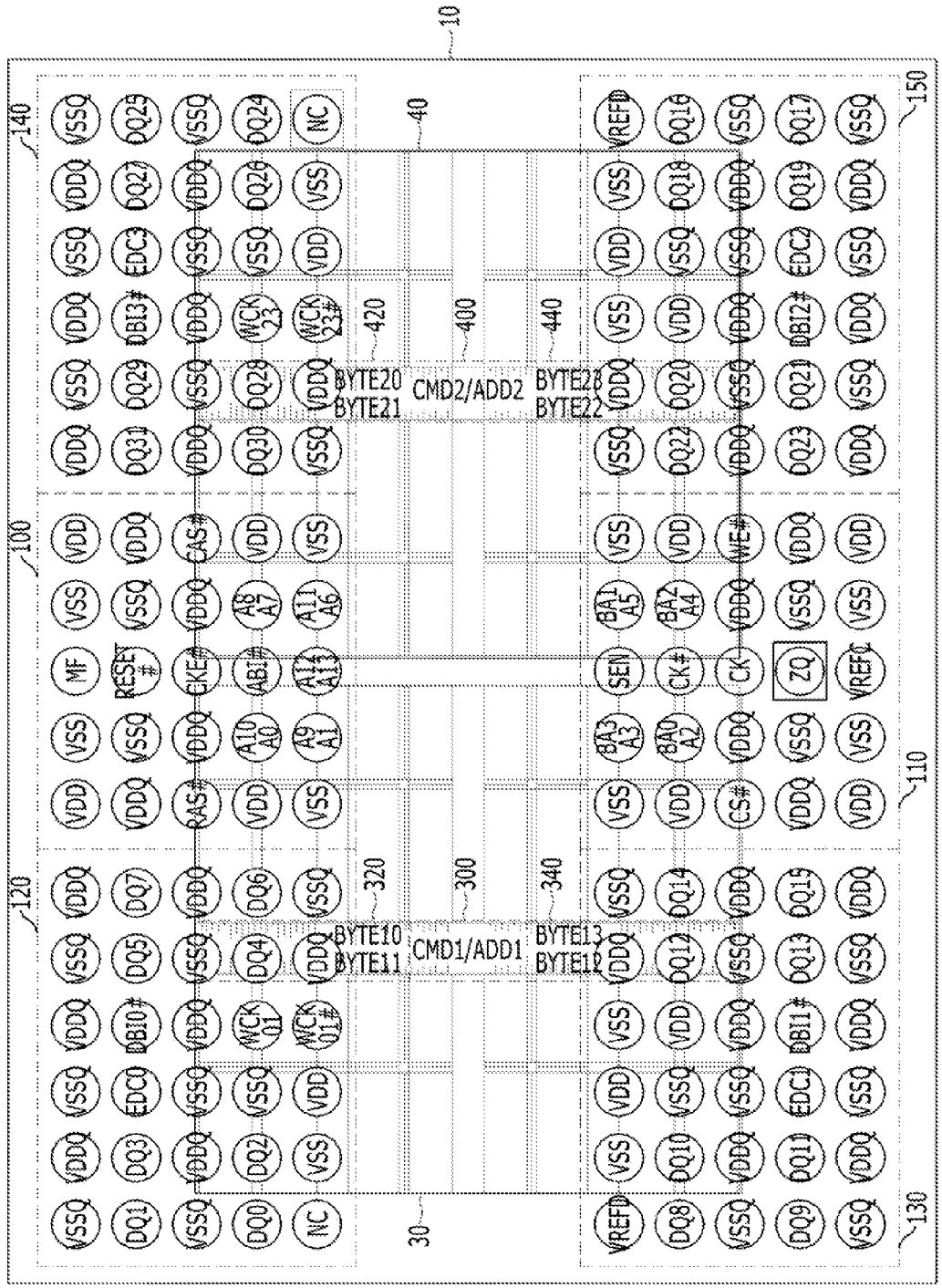
FIG. 3 illustrates an impedance calibration of the semiconductor device shown in FIG. 2.

FIG. 3 illustrates an impedance calibration of the semiconductor device shown in FIG. 2.

The reason why impedance calibration is required for semiconductor devices is briefly described below.

The semiconductor devices are applied to various electric devices, and widely applied to many different fields. Also, as the electric devices operate at high speed, the swing width of a signal exchanged between the semiconductor devices may be decreased in order to minimize delay time occurring in the signal transmission process. As the swing width of the signal is decreased, the effect of noise is increased, and reflection effects of the signals caused by an impedance mismatch between the semiconductor devices intensifies. The impedance mismatch occurs due to variations in Process, Voltage and Temperature (PVT), and consequently high-speed transmission of data is disturbed, and output data are distorted.

To solve these problems, an On-Die Termination (ODT) circuit is applied to the semiconductor devices required for high-speed operations, and the impedance mismatch between output devices is settled through the ODT circuit. Therefore, the ODT circuit has to be realized to control resistance, and an impedance calibration circuit is introduced to control resistance of the ODT circuit through a predetermined pad such as a ZQ pad.

Although not illustrated in detail in FIG. 3, an ODT circuit, an impedance calibration circuit and a first ZQ pad are included inside the first semiconductor chip 30.

Similarly, although not illustrated in detail in FIG. 3, an ODT circuit, an impedance calibration circuit and a second ZQ pad are included inside the second semiconductor chip 40.

As illustrated in FIG. 3, a ZQ ball ZQ may be included in the package interface 10. Thus, the ZQ ball ZQ included in the package interface 10 may be commonly coupled with the first ZQ pad included in the first semiconductor chip 30 and the second ZQ pad included in the second semiconductor chip 40.

In other words, an impedance calibration operation on the first semiconductor chip 30 and an impedance calibration operation on the second semiconductor chip 40 may be controlled through the single ZQ ball ZQ included in the package interface 10.

Meanwhile, the package interface 10 shown in FIG. 3 may be designed for a single semiconductor chip such as the package interface 10 described with reference to FIG. 1. Thus, as illustrated in FIG. 3, a single ZQ ball ZQ may be included in the package interface 10.

In order to maximize the effect of the impedance calibration of the semiconductor chips, it is advantageous if the ZQ pad for the impedance calibration is independently included in every semiconductor chip. Therefore, a dummy ball NC which is available as well as the single ZQ ball ZQ included in the package interface 10 may be used for the impedance calibration.

For example, the ZQ ball ZQ included in the package interface 10 may be coupled with the ZQ pad of the first semiconductor chip 30, and the dummy ball NC included in the package interface 10 may be coupled with the ZQ pad of the second semiconductor chip 40. In other words, the impedance calibration operation on the first semiconductor chip 30 may be controlled through the single ZQ ball ZQ included in the package interface 10, and the impedance calibration operation on the second semiconductor chip 40 may be controlled through the single dummy ball NC included in the package interface 10.

In contrast, the ZQ ball ZQ included in the package interface 10 may be coupled with the ZQ pad of the second semiconductor chip 40, and the dummy ball NC included in the package interface 10 may be coupled with the ZQ pad of the first semiconductor chip 30. In other words, the impedance calibration operation on the second semiconductor chip 40 may be controlled through the single ZQ ball ZQ included in the package interface 10, and the impedance calibration operation on the first semiconductor chip 30 may be controlled through the single dummy ball NC included in the package interface 10.

As described above, when the impedance calibration operation is controlled by using the dummy ball NC which is available as well as the ZQ ball ZQ included in the package interface 10, more complicated control operations may be required than when the impedance calibration operations on the semiconductor chips 30 and 40 may be commonly controlled through the single ZQ ball ZQ.

When the impedance calibration operations on the semiconductor chips 30 and 40 may be commonly controlled through the single ZQ ball ZQ included in the package interface 10, a conventional impedance calibration operation, which is applied to the semiconductor chip 20 described with reference to FIG. 1, may be applied to the semiconductor chips 30 and 40.

However, when the impedance calibration operation is controlled by using the dummy ball NC as well as the ZQ ball ZQ included in the package interface 10, the conventional impedance calibration operation, which is applied to the semiconductor chip 20 described with reference to FIG. 1, may be applied to the semiconductor chips 30 coupled to the ZQ ball ZQ, and further, a separate impedance calibration operation may be applied to the semiconductor chips 40 coupled to the dummy ball NC.

Since the impedance calibration operation on the semiconductor chips 30 and 40 through the ZQ ball ZQ is widely known to those skilled in the art, a detailed description thereon is omitted herein.

Figure 4:
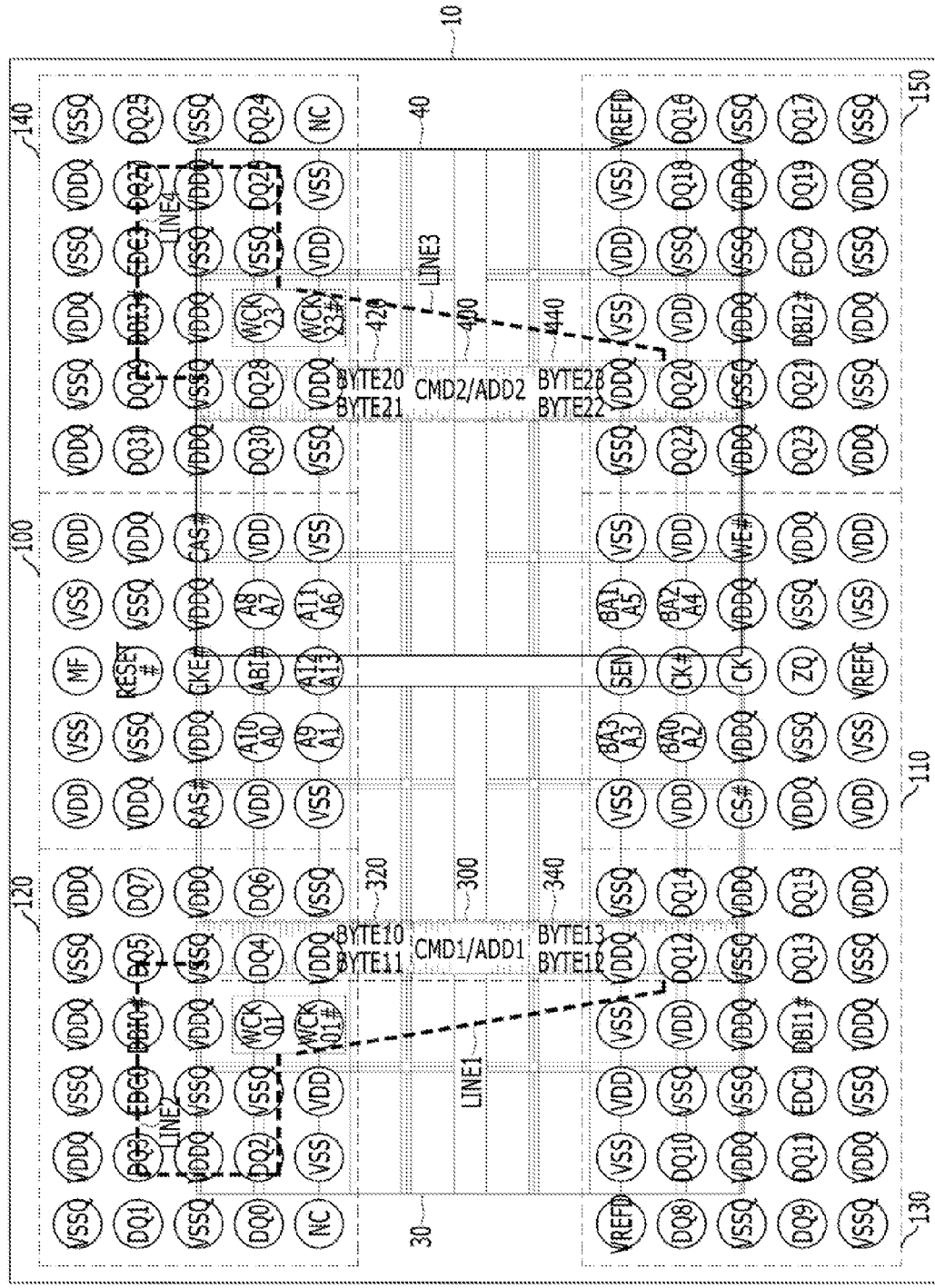
FIG. 4 illustrates data clock paths of the semiconductor device shown in FIG. 2.

FIG. 4 illustrates data clock paths of the semiconductor device shown in FIG. 2.

A data clock is a reference for input/output of data in the semiconductor device. A system clock is a reference for the input/output of signals related to operations of the semiconductor device such as commands/addresses of semiconductor devices.

Since the data of the semiconductor devices that have been developed recently are generally inputted/outputted at a high-speed, the frequency of the data clock is much higher than the frequency of the system clock, in general.

Therefore, it is an important issue to stably transmit the data clock since the reliability of the data transmission may considerably decrease even when a tiny jitter or noise occurs in the process of transmitting the data clock.

Referring to FIG. 4, the package interface 10 further includes a first group of data clock balls WCK01 and WCK01# which are disposed in the first region 120 of the one-side regions 120 and 130 and a second group of data clock balls WCK23 and WCK23# which are disposed in the first region 140 of the other-side regions 140 and 150.

The data clock supplied through the first group of data clock balls WCK01 and WCK01# may be transferred commonly to 2N numbers of the first group of data pads BYTE10, BYTE11, BYTE12 and BYTE13 included in the first semiconductor chip 30.

Particularly, the data clock has to be stably supplied to the quarter of 2N numbers of the first group of data pads BYTE10 among the half of 2N numbers of the first group of data pads BYTE10 and BYTE11 and the quarter of 2N numbers of the first group of data pads BYTE12 among the other half of 2N numbers of the first group of data pads BYTE12 and BYTE13 which are directly coupled with the package interface 10 among 2N numbers of the first group of data pads BYTE10, BYTE11, BYTE12 and BYTE13 included in the first semiconductor chip 30.

Since the quarter of 2N numbers of the first group of data pads BYTE10 among the half of 2N numbers of the first group of data pads BYTE10 and BYTE11 is disposed in the first region 320 of the first semiconductor chip 30, the quarter of 2N numbers of the first group of data pads BYTE10 among the half of 2N numbers of the first group of data pads BYTE10 and BYTE11 is relatively adjacent to the first region 120 of the one-side regions 120 and 130 of the package interface 10 where the first group of data clock balls WCK01 and WCK01# are disposed. Since the quarter of 2N numbers of the first group of data pads BYTE12 among the other half of 2N numbers of the first group of data pads BYTE12 and BYTE13 is disposed in the second region 340 of the first semiconductor chip 30, the quarter of 2N numbers of the first group of data pads BYTE12 among the other half of 2N numbers of the first group of data pads BYTE12 and BYTE13 is not relatively adjacent to the first region 120 of the one-side regions 120 and 130 of the package interface 10 where the first group of data clock balls WCK01 and WCK01# are disposed.

Therefore, a first line LINE1 that couples the first group of data clock balls WCK01 and WCK01# to the second region 340 of the first semiconductor chip 30 which is not relatively adjacent to the first group of data clock balls WCK01 and WCK01#, and a second line LINE2 that couples the first group of data clock balls WCK01 and WCK01# to the first region 320 of the first semiconductor chip 30 which is relatively adjacent to the first group of data clock balls WCK01 and WCK01# may be disposed so that the lengths of the first and second lines LINE1 and LINE2 may be the same as each other. For example, as shown in FIG. 4, the first line LINE1 couples the first group of data clock balls WCK01 and WCK01# to the second region 340 in a straight line, and the second line LINE2 couples the first group of data clock balls WCK01 and WCK01# to the first region 320 in a detour line so that the lengths of the first and second lines LINE1 and LINE2 may be the same as each other.

Similarly, the data clock supplied through the second group of data clock balls WCK23 and WCK23# may be transferred commonly to 2N numbers of the second group of data pads BYTE20, BYTE21, BYTE22 and BYTE23 included in the second semiconductor chip 40.

Particularly, the data clock has to be stably supplied to the quarter of 2N numbers of the second group of data pads BYTE20 among the half of 2N numbers of the second group of data pads BYTE20 and BYTE21 and the quarter of 2N numbers of the second group of data pads BYTE22 among the other half of 2N numbers of the second group of data pads BYTE22 and BYTE23 which are directly coupled with the package interface 10 among 2N numbers of the second group of data pads BYTE20, BYTE21, BYTE22 and BYTE23 included in the first semiconductor chip 40.

Since the quarter of 2N numbers of the second group of data pads BYTE20 among the half of 2N numbers of the second group of data pads BYTE20 and BYTE21 is disposed in the first region 420 of the second semiconductor chip 40, the quarter of 2N numbers of the second group of data pads BYTE20 among the half of 2N numbers of the second group of data pads BYTE20 and BYTE21 is relatively adjacent to the first region 140 of the other-side regions 140 and 150 of the package interface 10 where the second group of data clock balls WCK23 and WCK23# are disposed. Since the quarter of 2N numbers of the second group of data pads BYTE22 among the other half of 2N numbers of the second group of data pads BYTE22 and BYTE23 is disposed in the second region 440 of the second semiconductor chip 40, the quarter of 2N numbers of the second group of data pads BYTE22 among the other half of 2N numbers of the second group of data pads BYTE22 and BYTE23 is not relatively adjacent to the first region 140 of the other-side regions 140 and 150 of the package interface 10 where the second group of data clock balls WCK23 and WCK23# are disposed.

Therefore, when a third line LINE3 that couples second group of data clock balls WCK23 and WCK23# to the second region 440 of the second semiconductor chip 40 which is not relatively adjacent to the second group of data clock balls WCK23 and WCK23#, and a fourth line LINE4 that couples the second group of data clock balls WCK23 and WCK23# to the first region 420 of the second semiconductor chip 40 which is relatively adjacent to the second group of data clock balls WCK23 and WCK23# may be disposed so that the lengths of the third and fourth lines LINE3 and LINE4 may be the same as each other. For example, as shown in FIG. 4, the third line LINE3 couples second group of data clock balls WCK23 and WCK23# to the second region 440 in a straight line, and the fourth line LINE4 couples second group of data clock balls WCK23 and WCK23# to the first region 420 in a detour line so that the lengths of the third and fourth lines LINE3 and LINE4 may be the same as each other.

In accordance with the embodiments of the present invention, the command/address balls RAS#, CAS#, CS# and WE#/A<0:13> and BA<0:3> included in the package interface 10 may be shared by the two semiconductor chips, and the first and second groups of data balls DQ<0:7>, DQ<8:15>, DQ<16:23> and DQ<24:31> included in the package interface 10 may be divided into two groups of DQ<0:7> and DQ<8:15>/DQ<16:23> and DQ<24:31> for the two semiconductor chips 30 and 40, respectively, after the two semiconductor chips 30 and 40 are stacked in parallel over the package interface 10 where typically a single semiconductor chip 20 is stacked. Since the semiconductor chips 30 and 40 simultaneously operate while the data input/output bandwidth is reduced by half, both of the two semiconductor chips 30 and 40 may operate together as a single semiconductor chip through the package interface 10 while the typical data input/output bandwidth is maintained as it is.

Also, an operation control for the single semiconductor chip 20 may also be used for the two semiconductor chips 30 and 40.

To sum up, in accordance with the embodiments of the present invention, two semiconductor chips may operate as a single semiconductor chip since a plurality of command/address balls may be used commonly by the two semiconductor chips, and a plurality of data balls may be divided in half for the two semiconductor chips stacked in parallel over a package interface where typically a single semiconductor chip is stacked.

Therefore, the capacity of a package interface may be doubled while the size and control method of the package interface remain the same as conventional package interfaces.

While the present invention has been described with respect to specific embodiments, it is noted that the embodiments of the present invention are not restrictive but descriptive. Further, it is noted that the present invention may be achieved in various ways through substitution, change, and modification, by those skilled in the art without departing from the scope of the present invention as defined by the following claims.

What is claimed is:

1. A semiconductor device, comprising:
a package interface including N numbers of first group of data balls which are disposed on a first side thereof, N numbers of second group of data balls which are disposed on a second side thereof, and M numbers of command/address balls which are disposed between the first side and the second side;
a first semiconductor chip which is stacked on the first side over the package interface, and includes 2N numbers of first group of data pads and M numbers of first command/address pads; and
a second semiconductor chip which is stacked on the second side over the package interface, and includes 2N numbers of second group of data pads and M numbers of second command/address pads,
wherein M numbers of the first command/address pads and M numbers of the second command/address pads are commonly coupled with M numbers of the command/address balls,
wherein a half of 2N numbers of the first group of data pads are coupled with N numbers of the first group of data balls, and
wherein a half of 2N numbers of the second group of data pads are coupled with N numbers of the second group of data balls.

2. The semiconductor device of claim 1, wherein the first semiconductor chip operates with N-bit bandwidth by using the half of 2N numbers of the first group of data pads which are coupled with N numbers of the first group of data balls.

3. The semiconductor device of claim 2, wherein the second semiconductor chip operates with N-bit bandwidth by using the half of 2N numbers of the second group of data pads which are coupled with N numbers of the second group of data balls.

4. The semiconductor device of claim 3, wherein the package interface operates with 2N-bit bandwidth by using N numbers of the first group of data balls and N numbers of the second group of data balls in response to simultaneous enablement of the first semiconductor chip and the second semiconductor chip.

5. The semiconductor device of claim 1,
wherein the first side is the left side of the package interface,
wherein the second side is the right side of the package interface, and
wherein the second semiconductor chip is disposed horizontally adjacent to the first semiconductor chip.

6. The semiconductor device of claim 1,
wherein the first side is the right side of the package interface,
wherein the second side is the left side of the package interface, and
wherein the second semiconductor chip is disposed horizontally adjacent to the first semiconductor chip.

7. The semiconductor device of claim 1,
wherein the first semiconductor chip further includes a first ZQ pad,
wherein the second semiconductor chip further includes a second ZQ pad,
wherein the package interface further includes a ZQ ball, and
wherein the first ZQ pad and the second ZQ pad are commonly coupled with the ZQ ball.

8. The semiconductor device of claim 1,
wherein the first semiconductor chip includes a first ZQ pad,
wherein the second semiconductor chip further includes a second ZQ pad, wherein the package interface further includes a ZQ ball and a dummy ball, and wherein the first ZQ pad is coupled with the ZQ ball, and the second ZQ pad is coupled with the dummy ball.

9. The semiconductor device of claim 1, wherein N numbers of the first group of data balls are divided into a half of N numbers of the first group of data balls which are disposed in a first region and a other half of N numbers of the first group of data balls which are disposed in a second region of first side of the package interface, wherein N numbers of the second group of data balls are divided into a half of N numbers of the second group of data balls which are disposed in a first region and a other half of N numbers of the second group of data balls which are disposed in a second region of the second side of the package interface, wherein 2N numbers of the first group of data pads are divided into a half of 2N numbers of the first group of data pads which are disposed in a first region and a other half of 2N numbers of the first group of data pads which are disposed in a second region of the first semiconductor chip, wherein 2N numbers of the second group of data pads are divided into a half of 2N numbers of the second group of data pads which are disposed in a first region and a other half of 2N numbers of the second group of data pads which are disposed in a second region of the second semiconductor chip, wherein a quarter of 2N numbers of the first group of data pads among the half of 2N numbers of the first group of data pads are coupled with the half of N numbers of the first group of data balls, wherein a quarter of 2N numbers of the first group of data pads among the other half of 2N numbers of the first group of data pads are coupled with the other half of N numbers of the first group of data balls, wherein a quarter of 2N numbers of the second group of data pads among the half of 2N numbers of the second group of data pads are coupled with the half of N numbers of the second group of data balls, and wherein a quarter of 2N numbers of the second group of data pads among the other half of 2N numbers of the second group of data pads are coupled with the other half of N numbers of the second group of data balls.

10. The semiconductor device of claim 9, wherein the package interface further includes a first group of data clock balls which are disposed in the first region of the first side, and a second group of data clock balls which is disposed in the first region of the second side, and the semiconductor device further comprising:

a first line that couples the second region of the first semiconductor chip which is not relatively adjacent to the first group of data clock balls;

a second line that couples the first region of the first semiconductor chip which is relatively adjacent to the first group of data clock balls, and is a detour line having the same length as the first line;

a third line that couples the second region of the second semiconductor chip which is not relatively adjacent to the second group of data clock balls; and a fourth line that couples the first region of the second semiconductor chip which is relatively adjacent to the second group of data clock balls, and is a detour line having the same length as the third line.

11. A semiconductor device, comprising:

a package interface including a half of N numbers of a first group of data balls which are disposed in a first region of a first side, the other half of N numbers of the first group of data balls which are disposed in a second region of the first side, a half of N numbers of the second group of data balls which are disposed in a first region of a second side, the other half of N numbers of the second group of data balls which are disposed in a second region of the second side, and M numbers of command/address balls which are disposed in a middle region between the first side and the second side;

a first semiconductor chip which is stacked over the package interface and overlaps with the first region of the first side, the second region of the first side and a part of the middle region, and includes 2N numbers of first group of data pads and M numbers of first command/address pads; and a second semiconductor chip which is stacked over the package interface and overlaps with the first region of the second side, the second region of the second side and another part of the middle region, and includes 2N numbers of second group of data pads and M numbers of second command/address pads, wherein M numbers of the first command/address pads and M numbers of the second command/address pads are commonly coupled with M numbers of the address/command balls, wherein a quarter of 2N numbers of the first group of data pads overlapping with the first region of the first side are coupled with the a half of N numbers of the first group of data balls, wherein another quarter of 2N numbers of the first group of data pads overlapping with the second region of the first side are coupled with the other half of N numbers of the first group of data balls, wherein a quarter of 2N numbers of the second group of data pads overlapping with the first region of the second side are coupled with a half of N numbers of the second group of data balls, and wherein another quarter of 2N numbers of the second group of data pads overlapping with the second region of the second side are coupled with the other half of N numbers of the second group of data balls.

12. The semiconductor device of claim 11, wherein the first semiconductor chip operates with N-bit bandwidth by using the half of 2N numbers of the first group of data pads which are coupled with the half of N numbers of the first group of data balls and the other half of N numbers of the first group of data balls.

13. The semiconductor device of claim 12, wherein the second semiconductor chip operates with N-bit bandwidth by using the half of 2N numbers of the second group of data pads which are coupled with the half of N numbers of the second group of data balls and the other half of N numbers of the second group of data balls.

14. The semiconductor device of claim 13, wherein the package interface operates with 2N-bit bandwidth by using the half of N numbers of the first group of data balls, the other half of N numbers of the first group of data balls, the half of N numbers of the second group of data balls and the other half of N numbers of the second group of data balls in response to simultaneous enablement of the first semiconductor chip and the second semiconductor chip.

15. The semiconductor device of claim 11, wherein the first side is the left side of the package interface, and wherein the second side is the right side of the package interface.

16. The semiconductor device of claim 11,
wherein the first side is the right side of the package interface,
wherein the second side is the left side of the package interface.

17. The semiconductor device of claim 11,
wherein the first semiconductor chip further includes a first ZQ pad,
wherein the second semiconductor chip further includes a second ZQ pad,
wherein the package interface further includes a ZQ ball, and
wherein the first ZQ pad and the second ZQ pad are commonly coupled with the ZQ ball.

18. The semiconductor device of claim 11,
wherein the first semiconductor chip further includes a first ZQ pad,
wherein the second semiconductor chip further includes a second ZQ pad,
wherein the package interface further includes a ZQ ball and a dummy ball, and
wherein the first ZQ pad is coupled with the ZQ ball, and the second ZQ pad is coupled with the dummy ball.

19. The semiconductor device of claim 11,
wherein 2N numbers of the first group of data pads are divided into a half of 2N numbers of the first group of data pads which are disposed in a first region and the other half of 2N numbers of the first group of data pads which are disposed in a second region of the first semiconductor chip,
wherein 2N numbers of second group of data pads are divided into a half of 2N numbers of the second group of data pads which are disposed in a first region and the other half of 2N numbers of the second group of data pads which are disposed in a second region of the second semiconductor chip,
a quarter of 2N numbers of the first data pads among the half of 2N numbers of the first group of data pads are coupled with the half of N numbers of the first group of data balls;
a quarter of 2N numbers of the first data pads among the other half of 2N numbers of the first group of data pads are coupled with the other half of N numbers of the first group of data balls;
a quarter of 2N numbers of the second data pads among the half of 2N numbers of the second group of data pads are coupled with the half of N numbers of the second group of data balls; and
a quarter of 2N numbers of the second data pads among the other half of 2N numbers of the second group of data pads are coupled with the other half of N numbers of the second group of data balls.

20. The semiconductor device of claim 19,
wherein the package interface further includes a first group of data clock balls which is disposed in the first region of the first side, and a second group of data clock balls which is disposed in the first region of the second side, and
wherein the semiconductor device further comprises:
a first line that couples the second region of the first semiconductor chip which is not relatively adjacent to the first group of data clock balls;
a second line that couples the first region of the first semiconductor chip which is relatively adjacent to the first group of data clock balls, and is a detour line having the same length as the first line;
a third line that couples the second region of the second semiconductor chip which is not relatively adjacent to the second group of data clock balls; and
a fourth line that couples the first region of the second semiconductor chip which is relatively adjacent to the second group of data clock balls, and is a detour line having the same length as the third line.

* * * * *